DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED MARCH 7, 1972

896 O.G. 19

T896,019
LITHOGRAPHIC REPRODUCTIONS

Ralph Donald Zaffrann and Gale Francis Nadeau, Jr., both of 1669 Lake Ave., Rochester, N.Y. 14650

Filed Feb. 5, 1971, Ser. No. 113,106
**Int. Cl. G03f *7/02***
U.S. Cl. 96—33
No Drawing. 13 Pages Specification

The press latitude of lithographic plates having gelatin printing surfaces is widened by contacting the printing surface with an acidic stop bath containing 0.5 to 10% by weight of polypropylene glycol having an average molecular weight in the range from about 200 to about 2000. The stop bath is otherwise conventional and, preferably, does not contain benzyl alcohol, diethylene glycol or triethylene glycol.